(12) United States Patent
Konuk et al.

(10) Patent No.: US 6,771,549 B1
(45) Date of Patent: Aug. 3, 2004

(54) ROW-COLUMN REPAIR TECHNIQUE FOR SEMICONDUCTOR MEMORY ARRAYS

(75) Inventors: Haluk Konuk, Sunnyvale, CA (US); José L. Landivar, Sunnyvale, CA (US); Zongbo Chen, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/374,921

(22) Filed: Feb. 26, 2003

(51) Int. Cl.[7] .................................................. G11C 7/00
(52) U.S. Cl. .................................. 365/200; 365/189.07
(58) Field of Search ............................ 365/200, 189.07

(56) References Cited

U.S. PATENT DOCUMENTS 6,269,030 B1 * 7/2001 Hara ...................... 365/189.07
6,665,220 B2 * 12/2003 Vlasenko .................... 365/200

OTHER PUBLICATIONS

Dilip K. Bhavsar, "AN Algorithm for Row–Column Self-–Repair of RAMs and Its Implementation in the Alpha 21264," ITC International Test Conference, IEEE, 1999, pp. 311–318.
Yoshihiro Nagura, et al., "Test Cost Reduction By At–Speed BISR for Embedded DRAMs," ITC International Test Conference, IEEE, 2001, pp. 182–187
Shigeru Nakahara, et al., "Built–In Self–Test For GHz Embedded SRAMs Using Flexible Pattern Generator and New Repair Algorithm," ITC International Test Conference, IEEE 1999, pp. 3–1310.

Tomoya Kawagoe, et al., "A Built–In Self–Repair Analyzer (CRESTA) for Embedded DRAMs," ITC International Test Conference, IEEE, 2000, pp. 567–574.
S.–Y. Kuo, et al., "Modelling and Algorithms for Spare Allocation in Reconfigurable VLS," IEEE Proceedings–E, vol. 139, No. 4, Jul. 1992, pp. 323–328.
Roderick McConnell, et al., "Test and Repair of Large Embedded DRAMs: Part 1," ITC International Test Conference, IEEE 2001, pp. 163–172.
Eric Nelson, et al. "Test and Repair of Large Embedded DRAMs: Part 2," ITC International Test Conference, IEEE 2001, pp. 173–181.
John R. Day, et al., "A Fault–Driven Comprehensive Redundancy Algorithm," IEEE, Jun. 1985, pp. 35–44.
Sy-Yen Kuo, et al. "Efficient Spare Allocation for Reconfigurable Arrays," IEEE Design and Test, 1987, pp. 24–31.

* cited by examiner

Primary Examiner—Richard Elms
Assistant Examiner—Pho M. Luu
(74) Attorney, Agent, or Firm—Lawrence J. Merkel

(57) ABSTRACT

A method for locating a repair solution for a memory that includes a memory array containing a plurality of rows and a plurality of columns, N redundant rows, and M redundant columns. Both N and M are integers, where N is greater than or equal to zero and M is greater than or equal to zero. The N redundant rows and the M redundant columns are collectively referred to as redundant lines. The method includes generating a first defect matrix defects in the memory array. Additionally, the method includes recursively, until either the repair solution is found or the redundant lines are consumed: selecting a first line in the defect matrix and having at least one defect; generating a second defect matrix by eliminating at least the defects in the first line from the first defect matrix; and determining if the repair solution is found.

23 Claims, 9 Drawing Sheets

Fig. 10

ROW-COLUMN REPAIR TECHNIQUE FOR SEMICONDUCTOR MEMORY ARRAYS

BACKGROUND OF THE INVENTION

1. Field of the Invention

This invention is related to integrated circuit memories and, more particularly, to memories which include redundant columns and/or rows for repairing defects.

2. Description of the Related Art

Various integrated circuits may include large memories in addition to logic circuits. The memories may include various random access memory (RAM) arrays (e.g. static RAM (SRAM) or dynamic RAM (DRAM) arrays). For example, system-on-a-chip (SOC) integrated circuits may include a variety of caches and other large memories used by the processors and other system components included on the chip. In many cases, the memories may comprise 1⁄2 or more of the integrated circuit (or chip) area.

The transistors forming the memory arrays are often packed more densely into the chip area occupied by the memory arrays, as compared to the transistors outside of the memory arrays (e.g. the transistors in the logic circuits). Accordingly, the memory arrays are more susceptible to manufacturing defects. In order to reduce the impact of manufacturing defects in the memory arrays on the yield of the integrated circuits, the memories often include redundant rows and/or columns that may be used to repair defective rows and columns in the memory array.

Generally, the memory array must be tested to determine if there are any defects in the memory array and then redundant rows and columns may be selected to replace rows and columns in the array to eliminate the defects. For example, once the defects are located, one may exhaustively attempt combinations of row and/or column replacements to find a solution that repairs the defects. Typically, the memory array testing is performed during the overall integrated circuit testing performed on each manufactured integrated circuit (e.g. using automatic test equipment (ATE)). Testing time on the ATE is generally expensive, and thus the exhaustive method may be too costly to implement.

SUMMARY OF THE INVENTION

In one embodiment, a method for locating a repair solution for a memory is contemplated. The memory includes a memory array comprising a plurality of rows and a plurality of columns, N redundant rows, and M redundant columns. Both N and M are integers, where N is greater than or equal to zero and M is greater than or equal to zero. The N redundant rows and the M redundant columns are collectively referred to as redundant lines. The method includes generating a first defect matrix representing defects in the memory array. Additionally, the method includes recursively, until either the repair solution is found or the redundant lines are consumed: selecting a first line represented in the defect matrix and having at least one defect; generating a second defect matrix by eliminating at least the defects in the first line from the first defect matrix; and determining if the repair solution is found. A computer readable medium storing one or more instructions which, when executed, implement the method and an integrated circuit including circuitry that implements the method are also contemplated.

BRIEF DESCRIPTION OF THE DRAWINGS

The following detailed description makes reference to the accompanying drawings, which are now briefly described.

FIG. 10 is an example of memory repair according to one embodiment.

Figure 1:
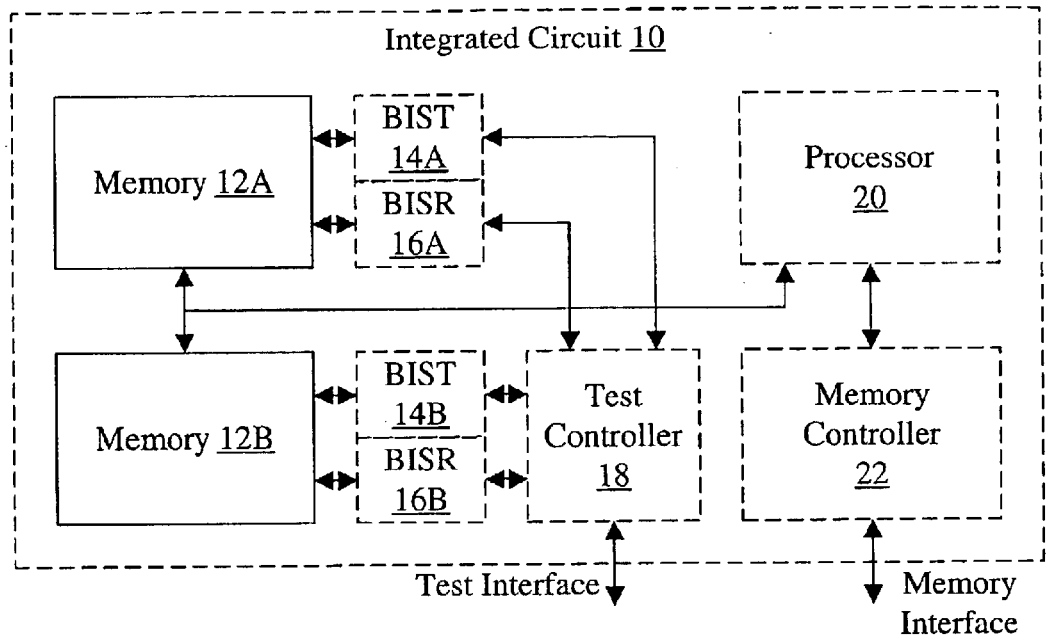
FIG. 1 is a block diagram of one embodiment of an integrated circuit including one or more memories.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. The integrated circuit 10 may include one or more memories (e.g. the memories 12A and 12B shown in FIG. 1). In some embodiments, built-in self-test (BIST) and/or built-in self-repair (BISR) circuits may be included (e.g. the BIST circuits 14A and 14B coupled to the memories 12A and 12B, respectively, and the BISR circuits 16A and 16B coupled to the memories 12A and 12B, respectively). The BIST circuits 14A–14B and the BISR circuits 16A–16B may be coupled to a test controller 18, which may have a test interface output from the integrated circuit 10. The integrated circuit 10 may include a processor 20 coupled to the memories 12A–12B and may further include a memory controller 22 coupled to the processor 20 and to a memory interface. It is noted that the elements of the integrated circuit 10 shown as dotted lines (e.g. the BIST circuits 14A–14B, the BISR circuits 16A–16B, the test controller 18, the processor 20, and the memory controller 22) may be optional and may be included or not included in embodiments of the integrated circuit 10 as desired. Additionally, embodiments including a single memory 12A are contemplated.

The integrated circuit 10 may be designed for any desired function, and may include circuitry and memories 12A–12B used to implement that function. For example, the integrated circuit 10 may include the processor 20, and may be a microprocessor. The memories 12A–12B may be caches implemented in the microprocessor or other arrays implemented in the microprocessor (e.g. translation lookaside buffers, branch prediction storage structures, predecode data storage, etc.). Alternatively, the integrated circuit 10 may include one or more processors 20 and supporting circuitry (e.g. the memory controller 22) in an integrated processor configuration (e.g. a microcontroller or embedded processor). In such an implementation, the memories 12A–12B may include caches or other memories for the processor 20, memories for the supporting circuitry, etc. Still further, one or more processors and one or more peripheral circuits (e.g. I/O interface circuits or integrated I/O peripherals) may be included in an SOC configuration. The memories 12A–12B may include caches or other memories for the processor 20, memories for the peripheral circuits, etc. The integrated circuit 10 may include no processors and thus may be a fixed-function integrated circuit such as an application specific integrated circuit (ASIC). The memories may be arrays used by the fixed-function circuitry. Generally, as used herein, a memory may comprise any storage implemented on an integrated circuit. For example, memory may include SRAM, DRAM, content addressable memory (CAM), etc.

The memories 12A–12B may include a memory array and one or more redundant rows and/or columns for repairing defects in the memory array. During manufacturing of the integrated circuit 10, the memories 12A–12B may be tested to detect any defects, and a repair solution may be determined to repair the defects. If no repair solution exists (i.e. the redundant rows and columns are insufficient in number to repair all of the defects), then the integrated circuit 10 may be discarded. An example of one embodiment of the memory 12A is shown in FIG. 2 and described in more detail below.

Figure 2:
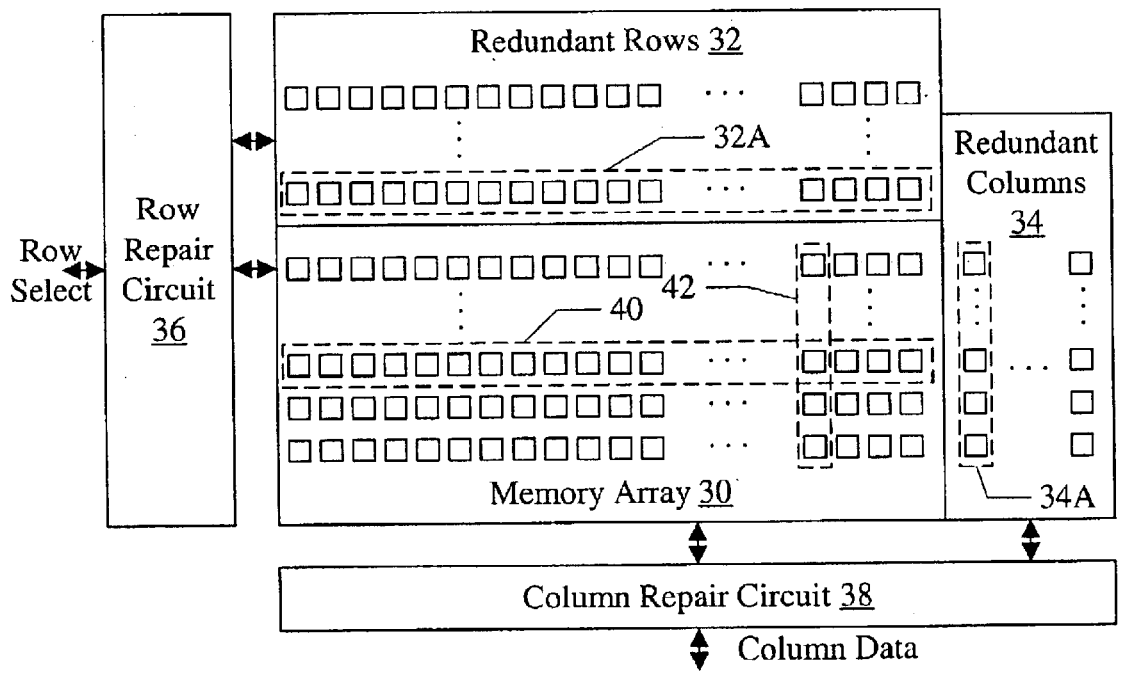
FIG. 2 is a block diagram of one embodiment of a memory in greater detail.

The memory 12A as illustrated in FIG. 2 includes a memory array 30, zero or more redundant rows 32, zero or more redundant columns 34, a row repair circuit 36, and a column repair circuit 38. The row repair circuit 36 is coupled to the memory array 30 and the redundant rows 32, and is coupled to receive row select controls for accessing a row in the memory. The row select controls may be generated by other circuitry within the memory 12A (not shown) responsive to one or more attributes of an access request for the memory. For example, the access request may include an address, and the address may be decoded to select a row. The column repair circuit 38 is coupled to the memory array 30 and the redundant columns 34, and may provide column data from the selected row (for a read of the memory 12A) or receive column data for the selected row (for a write of the memory 12A). The memory 12B may be similar.

Generally, the memory 12A is a two dimensional array of memory cells arranged as a set of rows and columns. A memory cell may store one or more bits of data stored in the memory, with a single bit per memory cell being typical currently. A given memory request selects a row of the memory 12A to be accessed, and the memory cells included in that row may be accessed in response to the memory request. If the memory request is a read, the memory cells in the selected row may output the stored data. If the memory request is a write, the memory cells in the selected row may update with the data supplied for the write. In some cases, a portion of a row may be selected for access by supplying column select controls. Thus, a row of the memory comprises a set of memory cells selected for a given memory request. Additionally, the memory cells in the array may be viewed as columns, where each memory cell in a given column is in the same location (e.g. same bit location) of different rows in the memory.

Initially, the rows and columns of the memory 12A may be the rows and columns in the memory array 30. However, if testing of the memory 12A (and thus of the memory array 30) reveals one or more manufacturing defects, then the redundant rows 32 and the redundant columns 34 may be used to replace a row or column, respectively, of the memory array 30 that includes a defect. If all of the defects in the memory array 30 can be corrected using redundant rows and/or columns, then the memory 12A may be made functional even in spite of the defects. Generally, a defect may be detected for a memory cell if the memory cell does not accurately store at least one state. (e.g. a bit cell that does not accurately store a binary one or a binary zero). The memory cells may be tested for each possible state (including when various other states are stored in neighboring cells) to detect defects.

The row repair circuit 36 may cause the replacement of a row or rows in the memory array 30 with redundant rows 32. Generally, each row selection indicated by the row select controls received by the row repair circuit 36 causes the selection of a different row within the memory array 30 or the redundant rows 32. Initially, each row selection may cause a selection of one of the memory array 30 rows. However, if a repair is instituted due to detection of a defect, then one of the redundant rows 32 may be selected for a given row select control. For example, if the row 40 in the memory array 30 includes a defect or defects and the redundant row 32A has been selected to repair the defect(s), the row repair circuit 36 may select the redundant row 32A in cases that the row 40 would have been selected.

The row repair circuit 36 may be implemented in a variety of fashions, depending on how the row repair is carried out. For example, in some embodiments, the row repair circuit may include a set of fuses. By "blowing" one or more fuses during testing of the integrated circuit 10, the row repair circuit 36 may be configured to map the row select controls to the desired set of rows. Any external stimulus may be used to blow the fuses. For example, a laser may be used. In other embodiments, the desired configuration may be programmed into the row repair circuit 36 when the integrated circuit 10 is powered up.

Similarly, the column repair circuit 38 may cause the replacement of a column or columns in the memory array 30 with redundant columns 34. Each column data bit may be mapped to one of the columns in the memory array 30 or a redundant column 34. Initially, each column in the memory array 30 is mapped to a column data bit (or bits). However, if a repair is instituted due to detection of a defect, then one of the redundant columns 34 may be selected instead of a defective column in the memory array 30. For example, if the column 42 in the memory array 30 includes a defect or defects and the redundant column 34A has been selected to repair the defect(s), the column repair circuit 38 may select the redundant column 34A to output data instead of the column 42. The column repair circuit 38 may be implemented in a variety of fashions, similar to the discussion of the row repair circuit 36 described above.

In other embodiments, the memory 12A may implement only redundant rows 32 (i.e. no redundant columns 34). In such an embodiment, the column repair circuit 38 may not be included and the column data lines may be directly wired to the columns in the memory array 30. Similarly, in other embodiments, the memory 12A may implement only redundant columns 34 (i.e. no redundant rows 32). In such an embodiment, the row repair circuit 36 may not be included and the row selection controls may be directly wired to the rows in the memory array 30. For example, the row selection controls may comprise a word line for each row, which may be directly wired to that row.

In some embodiments, two or more redundant rows may be grouped and may be used to replace a like number of rows as a unit. For such embodiments, the term "redundant row" or "row" may refer to the group of rows as a unit. Similarly, in some embodiments, two or more redundant columns may be grouped and may be used to replace a like number of columns as a unit. For such embodiments, the term "redundant column" or "column" may refer to the group of columns as a unit.

Figure 3:
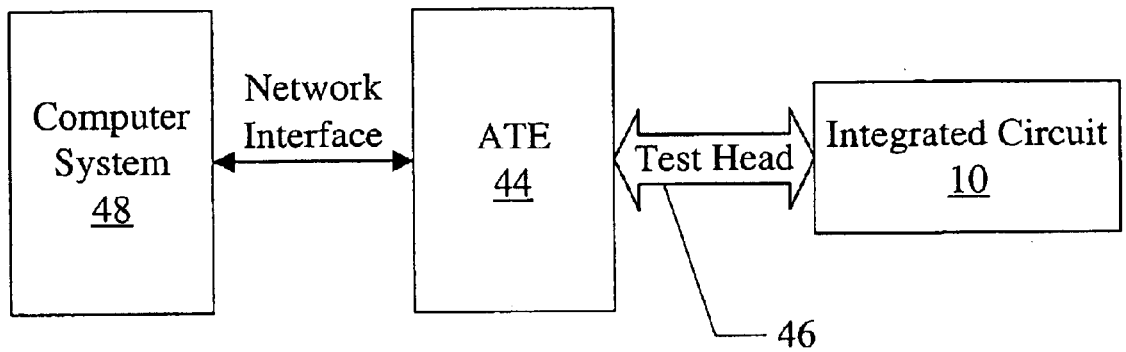
FIG. 3 is a block diagram of one embodiment of a test system for the integrated circuit.

FIG. 3 is a block diagram of one embodiment of a test system for the integrated circuit 10. In the illustrated embodiment, an ATE 44 is shown. The ATE 44 may couple to the integrated circuit 10 during testing using a test head 46, which is configured to make electrical contact with the integrated circuit 10. For example, the integrated circuit 10 may be part of a semiconductor wafer on which multiple instantiations of the integrated circuit 10 have been fabricated. In such tests, the test head 46 may make electrical contact with the pads on the integrated circuit 10 (which will later be electrically connected to the pins on the package used for the integrated circuit 10). For example, the pads may include pads for the test interface and the memory interface shown in FIG. 1.

Using the test head 46, the ATE 44 may drive various signals used to interface to the integrated circuit 10 and may observe the values on other signals from the integrated circuit 10. The ATE may be provided with test vectors indicating the desired states to be driven on the signals and the expected output. Additionally or alternatively, the ATE may output observed states to another computer system (e.g. the computer system 48 shown in FIG. 3) for further processing. The computer system 48 may be coupled to the ATE 44 using any communication interface. For example, a network interface may be used, as shown in FIG. 3, such as an Ethernet or token ring interface. Alternatively, various direct communication interfaces may be used (e.g. a Universal Serial Bus (USB) connection, other serial or parallel interfaces, a peripheral component interconnect (PCI) bus or other standard peripheral buses, etc.).

In one specific embodiment, the ATE 44 may include the Agilent 93000 series SOC tester from Agilent Technologies (Palo Alto, Calif.). The network connecting the ATE 44 to the computer system 48 may be a fiber optic interconnect. The computer system 48 may be a Visualize workstation from Hewlett-Packard Company (Palo Alto, Calif.). However, any ATE 44, computer system 48, and network may be used.

Figure 4:
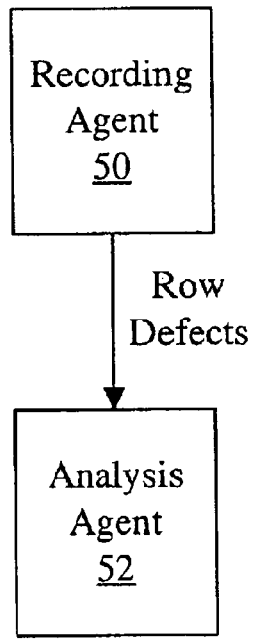
FIG. 4 is a block diagram of one embodiment of a recording agent and an analysis agent.

FIG. 4 illustrates two agents (a recording agent 50 and an analysis agent 52) which may represent the operations performed, in one embodiment, to test a memory 12A–12B in an integrated circuit 10 and to determine if there is a repair solution for the memory 12A–12B. The memory 12A–12B being tested is referred to below as the memory under test.

Generally, the recording agent 50 performs the memory test on the memory under test. Any memory test algorithm may be used. For example, any of the March testing algorithms may be used (e.g. the March C+ algorithm, in one particular implementation). The recording agent 50 identifies the defects in the memory array 30 of the memory under test on a row by row basis, and passes the row defect information to the analysis agent 52. The analysis agent 52 analyzes the row defect information and attempts to find a repair solution for the memory under test. Generally, a repair solution may be an indication of the rows and/or columns in the memory array 30 to be replaced with redundant rows and/or columns to alleviate the defects in the memory under test. If no repair solution is found, then the memory under test is not repairable and the analysis agent 52 may indicate that there is no repair solution.

Generally, in a memory having both redundant rows and columns, a given defect may be repaired using either a redundant row or a redundant column. Certain rows may be identified as "must-replace" rows by the recording agent 50. A must-replace row is a row having a number of defects greater than the number of redundant columns 34 implemented by the memory under test. Since there are not enough redundant columns to repair all of the defects in the row (by replacing each defective column in the row with a redundant column 34), a must-replace row is a row which must be repaired using a redundant row 32. Similarly, a "must-replace" column is a column having a number of defects greater than the number of redundant rows implemented by the memory under test.

The recording agent 50 may output the defective row information in any format. Generally, the recording agent 50 may identify whether or not a given row is a must-replace row. If the given row is not a must-replace row, the recording agent 50 may identify the column positions of the defects in the given row (if any). The recording agent 50 may, for example, output up to N numbers, where N is an integer equal to the number of redundant columns. Each number may indicate a defective column position. Alternatively, a bit vector may be output, with one bit for each column position in the row. The bit may be indicative of whether or not the column position includes a defect.

The analysis agent 52 may generate a defect matrix from the row defects supplied by the recording agent 50. As used herein, a defect matrix includes any data structure capable of identifying the defects in the memory under test. The must-replace rows may not be included in the defect matrix since redundant rows must be selected for these rows. The defect matrix may represent the defects in any fashion. For example, the defect matrix may represent each memory cell in the memory array 30 of the memory under test, identifying each defective memory cell. Alternatively, the defect matrix may include only the rows with defects, with each column of the row in the matrix and an indication at each column position of whether or not the column is defective. In yet another alternative, only the columns with defects may be included in the defect matrix, with each row included in the defect matrix and an indication in each row of whether there is a defect in the column. Still further, the defect matrix may include a total number of rows equal to the total number of rows with defects (except for must replace rows) and a total number of columns equal to the total number of columns with defects. Each row of the defect matrix may include an identification of the corresponding row in the memory under test and each column of the defect matrix may include an identification of the corresponding column in the memory under test. At the intersection of each row and column in the defect matrix, an indication of whether or not a defect occurs at that row and column is stored. The indication may be a bit indicative, when set, of a defect and indicative, when clear, of no defect. The opposite meanings of the set and clear states may also be used.

For the remainder of this discussion, the notion of a "line" and a "cross line" may be useful. As used herein, a line is either a row or a column. The term "cross line" is used relative to a given line, and refers to a line that crosses the given line. Thus, a cross line is a row if the line is a column, and a cross line is a column if the line is a row.

The analysis agent recursively performs the following to locate a solution: selecting a line indicated in the defect matrix as having one or more defects, generating a new defect matrix with at least the defects from the selected line deleted, and determining if a solution has been fund (e.g. by checking the new defect matrix for any remaining defects). Each selection consumes at least one redundant line, and the recursion continues (with the new defect matrix and numbers of available columns and rows adjusted to represent consumed redundant rows and columns at each call) as long as redundant lines remain to be consumed and a solution has not been found. If all defects are eliminated from the defect matrix, then a solution has been found. If all redundant lines have been consumed without a solution, then there is no solution.

If the memory under test includes both redundant rows and columns, then the recursion may be performed for one possible selection of redundant lines (e.g. a redundant line or one or more redundant cross lines) and, if no solution is found, then the other selection is attempted to determine if there is a solution. If no solution is found for either case, then there is no repair solution for the memory under test. Additional details for one embodiment of the analysis agent are discussed below.

The above method may result in a solution (or in the detection of no solution), in some cases, more rapidly than exhaustively attempting each possible repair solution to detect if a solution exists. The method may guarantee to find a solution if a solution exists. Additionally, for embodiments in which the analysis agent 52 is implemented outside of the integrated circuit 10 (e.g. on the computer system 48), the amount of data communicated to the analysis agent 52 by the recording agent 50 may be relatively small.

Returning to FIG. 1, the testing of the memories 12A–12B may be performed in a variety of fashions. For example, the BIST circuits 14A–14B may test the memories (e.g. the BIST circuits 14A–14B may implement the recording agent 50), and may report the detected defects on the test interface through the test controller 18. Generally, the test controller 18 may be configured to communicate on the test interface and to communicate with other circuitry on the integrated circuit 10 for test purposes. For example, the test controller 18 may receive commands requesting a memory test of one of the memories 12A–12B, and may indicate to the BIST circuit 14A–14B coupled to the requested memory that a memory test is to be performed. The test controller 18 may receive results of testing the memory from the BIST circuit 14A–14B, and may provide the results on the test interface (thus permitting the test results to be observed, e.g., by the ATE 44). For example, the test controller 18 may include circuitry compatible with the Joint Test Access Group (JTAG) interface described in the Institute for Electrical and Electronic Engineers (EEE) specification 1149.1-1990. Other embodiments of the test controller 18 may implement any other test interface (e.g. boundary scan interfaces, or custom test interfaces for the integrated circuit 10). In this embodiment, the analysis agent 52 may be implemented in the computer system 48 or on the processor 20, if desired.

Alternatively, the BIST circuits 14A–14B may perform the memory test and provide results to the BISR circuits 16A–16B, which may attempt to find a repair solution using the redundant rows and columns (e.g. the BISR circuits 16A–16B may implement the analysis agent 52). The BISR circuits 16A–16B may report the repair solution to the test controller 18 which, may drive the repair solution on the test interface 18 (thus making the repair solution observable, e.g., by the ATE that is testing the integrated circuit 10). In yet another alternative, if the memory 12A–12B being tested implements a repair mechanism that does not use an external stimulus to, e.g., blow fuses), the BISR circuits 16A–16B may cause the memory to implement the repair solution, and may report unrepairable cases to the test controller 18 for communication on the test interface. In other embodiments, the BIST circuits 14A–14B and the BISR circuits 16A–16B may communicate results through other interfaces on the integrated circuit 10, such as the memory interface through the memory controller 22 or an I/O interface (not shown), and the test controller 18 may be eliminated.

In other embodiments, the recording agent 50 and/or the analysis agent 52 may be implemented in software executing on the embedded processor 20. Such embodiments may eliminate the BIST circuits 14A–14B, the BISR circuits 16A–16B, and the test controller 18. Alternatively, the software may interface with BIST circuits 14A–14B and/or BISR circuits 16A–16B to perform the desired testing and/or repairing. The processor 20 may have access to the memories 12A–12B, to read and write memory locations in the memories 12A–12B to perform the test. The software executing on the processor 20 may test the memories 12A–12B and may report the test results through the memory controller 22 on the memory interface. That is, the software may include store instructions which store test results to "memory locations" in the memory that would be attached to the memory interface, and thus the test results may appear on the memory interface and may be observable by, e.g., the ATE 44. The processor 20 may also find the repair solution, and may report the repair solution through the memory controller 22 on the memory interface. Alternatively, the processor 20 may report the repair solution (or the lack of a solution) on any I/O interface to the integrated circuit 10 (e.g. by executing store instructions targeting the I/O interface).

For embodiments in which the recording agent 50 and/or the analysis agent 52 are implemented in software executing on the processor 20, any mechanism for loading the software into the integrated circuit may be used. For example, if the integrated circuit 10 implements a test interface that permits scanning of information into the integrated circuit 10, the test interface may be used to, e.g., scan the instructions comprising the software into the instruction cache of the processor 20. Alternatively, the processor 20 may be permitted to generate fetch requests, which may cause activity on the memory interface, to which the ATE may respond (as indicated by the test vectors) by supplying the instructions on the memory interface. The processor 20 may cache the instructions according to its normal operation in such cases.

In yet other embodiments, the recording agent 50 and/or the analysis agent 52 may be implemented in software on the computer system 48.

It is noted that, in other embodiments, some memories 12A–12B may be tested and/or repaired using BIST circuits 14A–14B and/or BISR circuits 16A–16B while other memories may be tested and/or repaired using software executing on the processor 20 or external to the integrated circuit 10. Any mix of implementing test and repair algorithms in hardware and software may be used. In some embodiments, the analysis agent 52 may also map the repair solution to an indication of which fuses to blow in the row repair circuit 36 and/or the column repair circuit 38 to implement the repair solution.

It is noted that, in some implementations, the analysis agent 52 may begin operation on partial row defect information (e.g. before the recording agent 50 completes the memory test for a given memory under test). Such operation may, in some cases, detect that no solution exists before the memory test completes and thus may cause the memory test to be stopped, thereby potentially reducing test time when no solution exists. If the analysis agent 52 detects a solution, the analysis agent 52 may reexecute on the complete memory test data provided by the recording agent 50.

FIGS. 5–9 illustrate additional details for one embodiment of the recording agent 50 and the analysis agent 52. The embodiment shown is used for memories which have both redundant rows and redundant columns. A memory having only redundant rows may operate by assuming the number of redundant columns is zero (or by appropriately recoding to eliminate attempts to use redundant columns). In such embodiments, only one attempt to recursively find a solution is performed, and cross line solutions are not attempted. Additionally, detection of a must-replace column indicates that there is no solution for such embodiments. Similarly, a memory having only redundant columns may operate by assuming the number of redundant rows is zero (or by appropriately recoding). In such embodiments, only one attempt to recursively find a solution is performed, and cross line solutions are not attempted. Additionally, detection of a must-replace row indicates that there is no solution for such embodiments.

Figure 5:
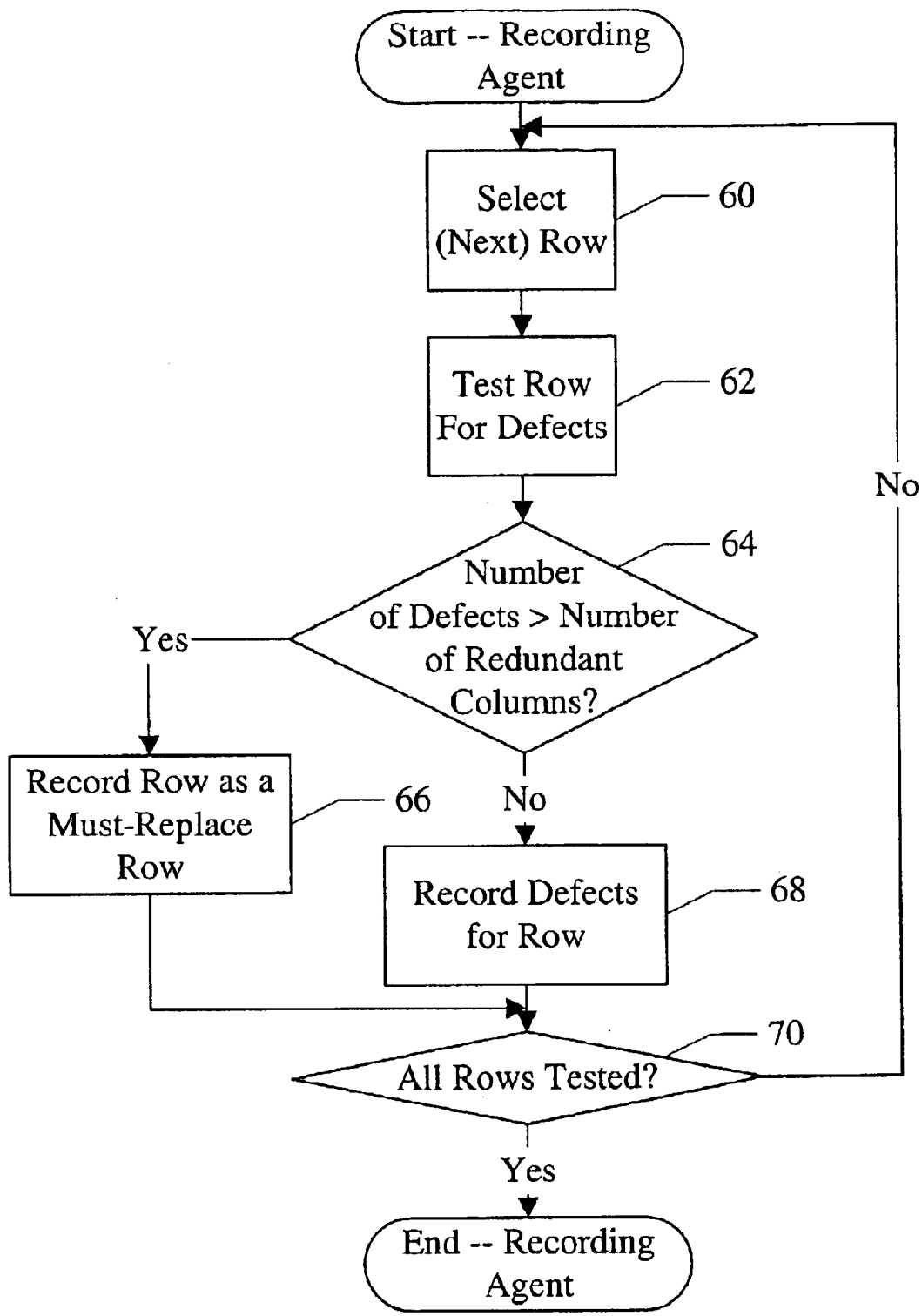
FIG. 5 is a flowchart illustrating operation of one embodiment of the recording agent.

Turning next to FIG. 5, a flowchart illustrating operation of one embodiment of the recording agent 50 is shown. While the blocks are shown in FIG. 5 in a particular order for ease of understanding, other orders may be used. Additionally, embodiments implementing the recording agent 50 in hardware may perform various blocks in parallel and/or may pipeline various blocks over multiple clock cycles, as desired. For embodiments implementing the recording agent 50 in software, the software may include one or more instructions which, when executed, perform the operation shown in FIG. 5.

The recording agent 50 selects a row (or the next row, for subsequent iterations) of the memory under test and tests the row for defects (blocks 60 and 62). The recording agent 50 checks if the number of defects in the row is greater than the number of redundant columns in the memory under test (decision block 64). If the number of defects exceeds the number of redundant columns, the recording agent 50 records the row as a must-replace row (block 66). If the number of defects does not exceed the number of redundant columns, the recording agent 50 records the defects for the row (block 68). The recording agent 50 determines if the all rows of the memory under test have been tested (decision block 70). If all rows have not yet been tested, the recording agent 50 repeats blocks 60–68 for the next row. If all rows have been tested, the recording agent 50 exits (or begins testing another memory on the integrated circuit 10, if desired).

Recording the row as a must-replace row or recording the defects for the row (blocks 66 and 68) may generally include transmitting the defect information to analysis agent 52. The transmission may occur in various fashions, depending on the implementation, as described above.

Figure 6:
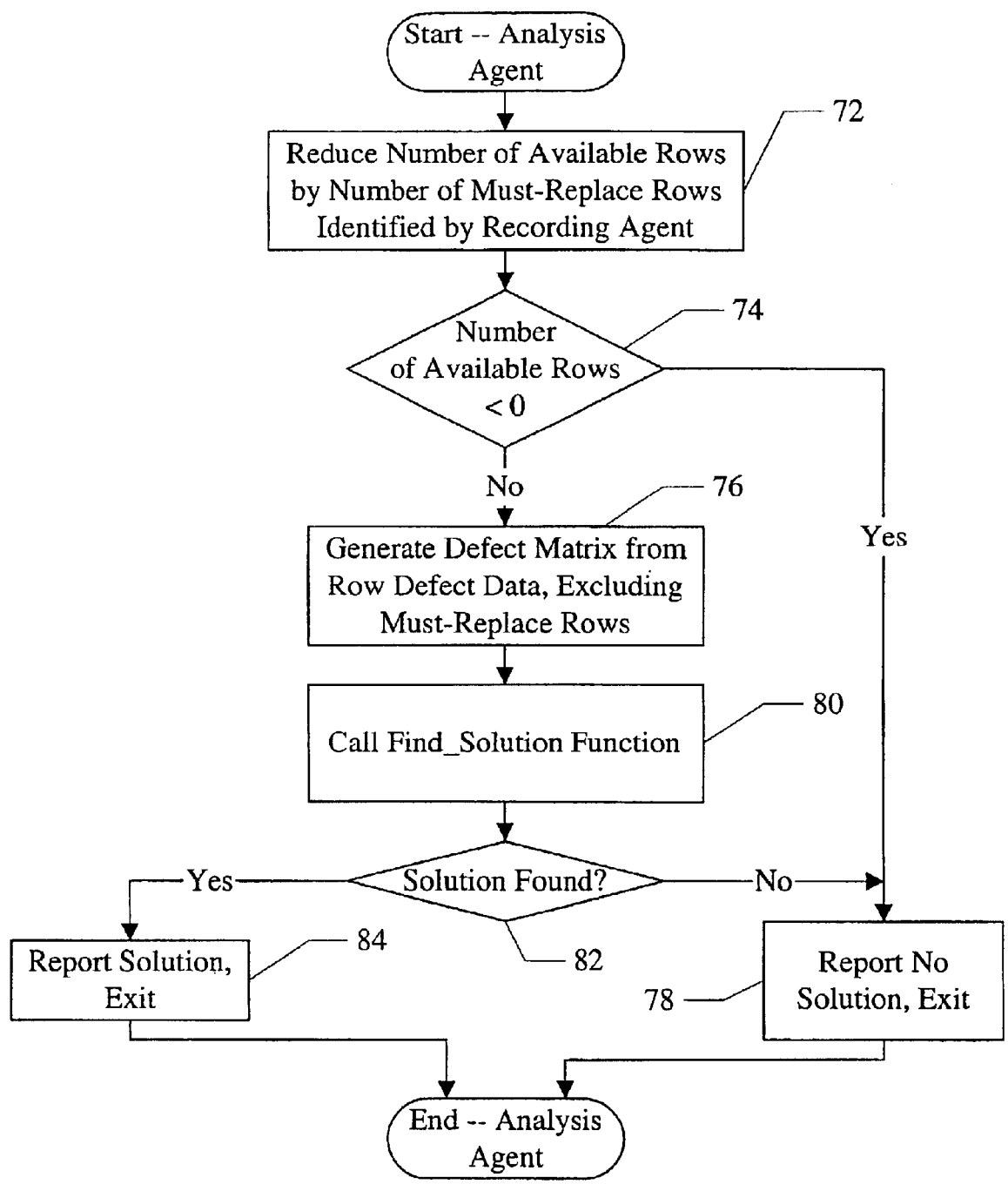
FIG. 6 is a flowchart illustrating operation of one embodiment of the analysis agent.

Turning next to FIG. 6, a flowchart is shown illustrating operation of one embodiment of the analysis agent 52. While the blocks are shown in FIG. 6 in a particular order for ease of understanding, other orders may be used. Additionally, embodiments implementing the analysis agent 52 in hardware may perform various blocks in parallel and/or may pipeline various blocks over multiple clock cycles, as desired. For embodiments implementing the analysis agent 52 in software, the software may include one or more instructions which, when executed, perform the operation shown in FIG. 6.

The analysis agent 52 may begin operation with the number of available rows equal to the number or redundant rows in the memory under test and the number of available columns equal to the number of redundant columns in the memory under test. However, in the present embodiment, the recording agent 50 may identify must-replace rows. The analysis agent 52 may filter out the must-replace rows prior to attempting to find a solution. The filtering may be represented by blocks 72 and 74, and by excluding the must replace rows in block 76, for example. The analysis agent 52 may reduce the number of available rows by the number of must-replace rows (block 72) and then may check if the number of available rows is less than zero (decision block 74). If the number of available rows is less than zero, then there are not enough redundant rows to repair the must-replace rows, and thus the analysis agent 52 may report that there is no solution and may exit (block 78).

Figure 7:
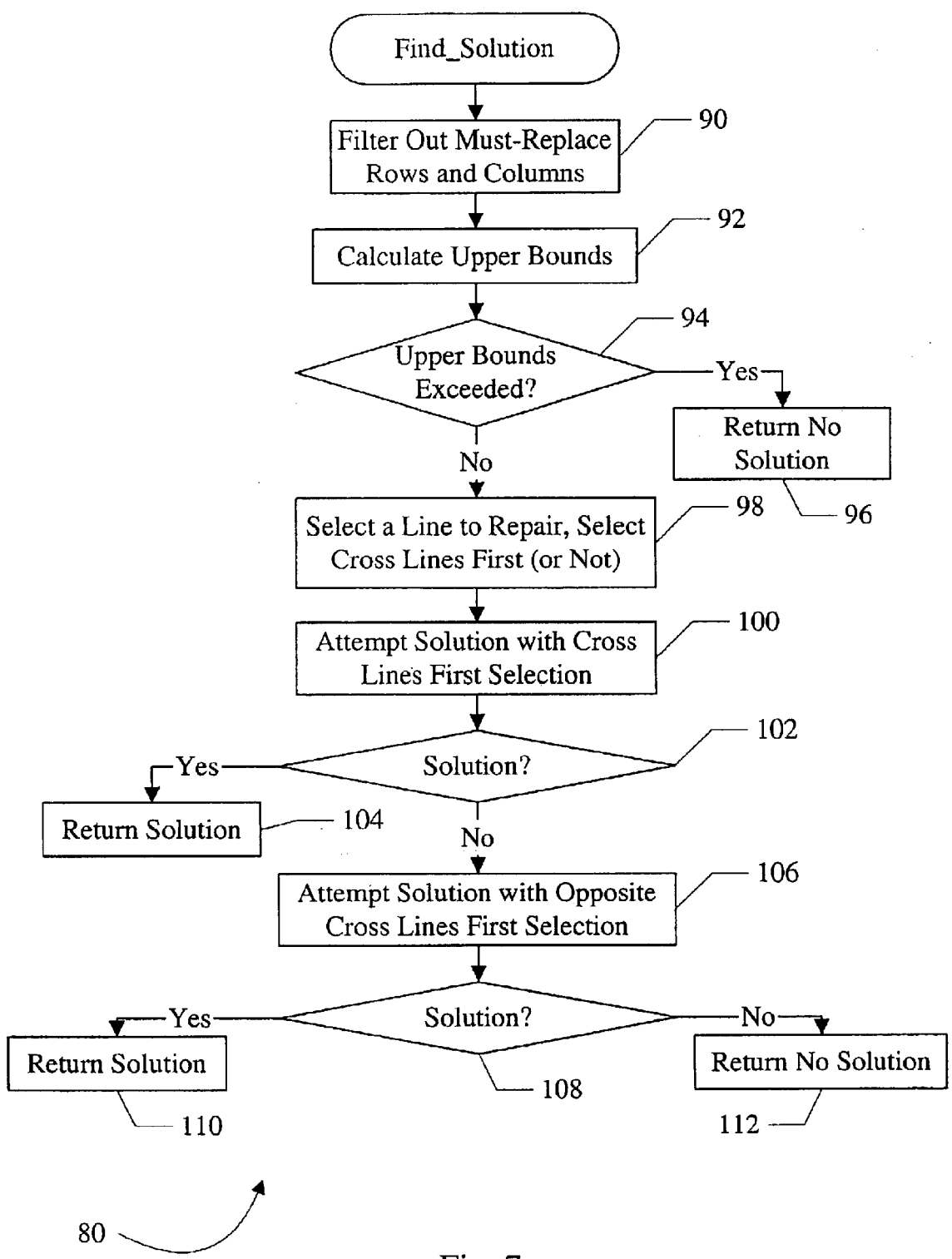
FIG. 7 is a flowchart illustrating one embodiment of a find solution function shown in FIG. 6.

If the number of available rows is greater than or equal to zero, then a solution may still exist. In this case, the analysis agent 52 generates the defect matrix from the row defect data, excluding the must-replace rows (since these rows are already assigned redundant rows for repair) (block 76). The analysis agent 52 attempts to recursively select a line represented in the defect matrix for replacement, remove the defects in the line from the defect matrix, and check if a solution has been found. In FIG. 6, this operation is performed by the find solution function (Find_Solution) (block 80, one embodiment of which is illustrated in FIG. 7). The find solution function receives the defect matrix, the number of available rows (reduced as indicated in block 72, if applicable), and the number of available columns (if applicable) as input, and performs the recursion to attempt to find a solution. The find solution function may return a repair solution or an indication that there is no solution. If there is no solution (decision block 82—"no" leg), then the analysis agent 52 reports that there is no solution and exits (block 78). If there is a solution (decision block 82—"yes" leg), the analysis agent 52 may update the repair solution to indicate the must-replace rows detected by the recording agent 50 and filtered at block 72, and exits (block 84).

It is noted that, while the present embodiment filters out the must-replace rows indicated by the recording agent, other embodiments may not filter the must-replace rows. For example, the must-replace rows may be represented in the defect matrix as rows with defects in each column. The find solution function 80 may then detect the must-replace rows. Generally, filtering must-replace rows (or columns) may refer to recording the must-replace rows (or columns) in the repair solution and reducing the number of available rows (or columns) by the number of must-replace rows (or columns) to reflect usage of redundant rows (or columns) to repair the must-replace rows (or columns).

Turning next to FIG. 7, a flowchart is shown illustrating one embodiment of the find solution function 80. While the blocks are shown in FIG. 7 in a particular order for ease of understanding, other orders may be used. Additionally, embodiments implementing the analysis agent 52 in hardware may perform various blocks in parallel and/or may pipeline various blocks over multiple clock cycles, as desired. For embodiments implementing the analysis agent 52 in software, the software may include one or more instructions which, when executed, perform the operation shown in FIG. 7.

Figure 9:
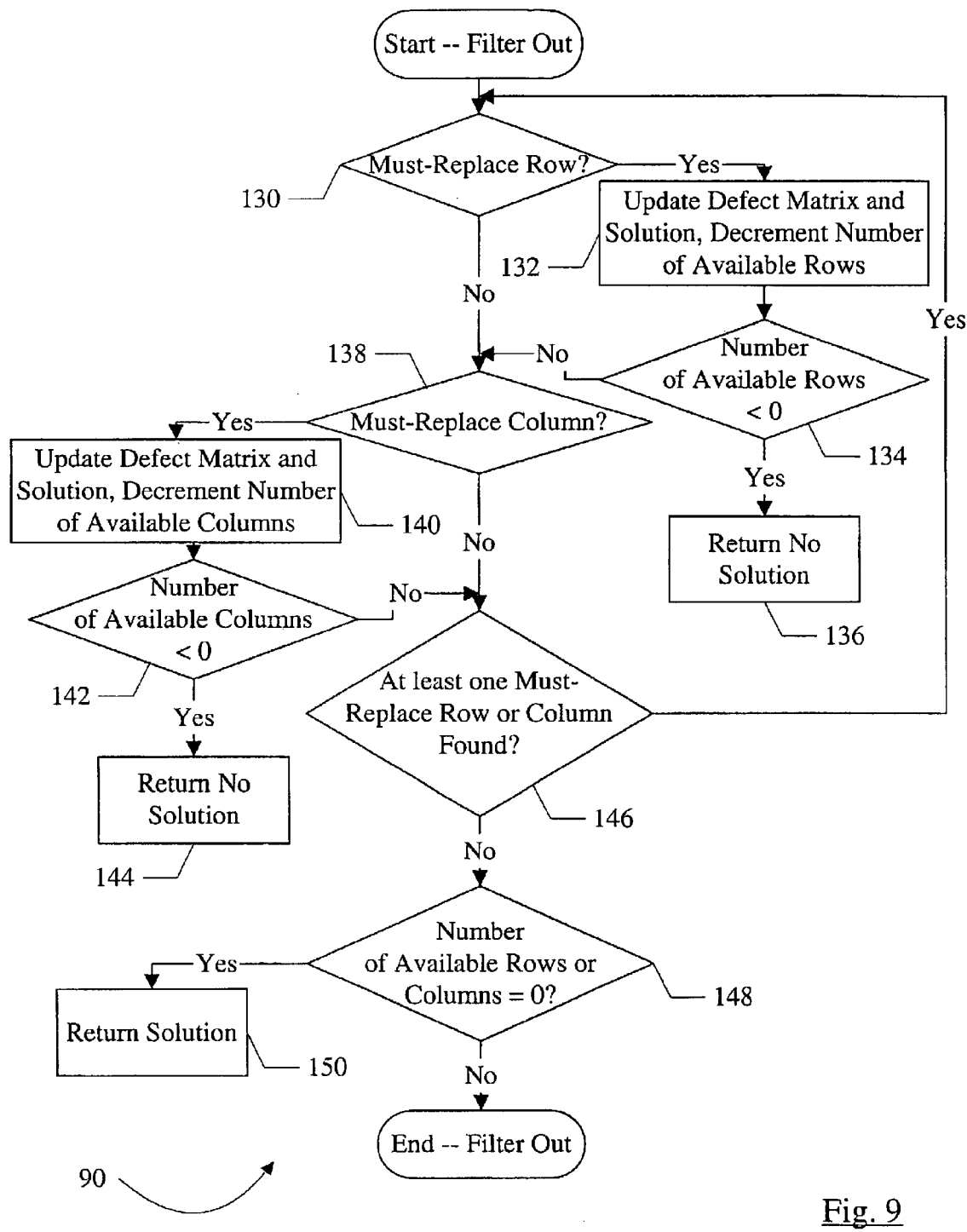
FIG. 9 is a flowchart illustrating one embodiment of filtering out must-replace rows and columns.

The find solution function 80 may filter out must-replace rows and must-replace columns (block 90). Presumably, on the first call to the find solution function 80 (by the analysis agent 52, as illustrated in FIG. 6), there will be no must-replace rows (since these were filtered out, in this embodiment, by the analysis agent 52 prior to calling the find solution function 80). However, it is possible that there are one or more must-replace columns. Detecting must-replace columns (and thus reducing the number of available columns) may result in additional must-replace rows. Additionally, in recursive calls to the find solution function 80, filtering the must-replace rows and columns is performed again since the number of available rows and columns has been changed in the previous call to the find solution function 80. A flowchart of one embodiment of the block 90 is illustrated in FIG. 9 and described in more detail below.

The find solution function 80 may perform an upper bounds check on the number of defects in the defect matrix, and may return an indication of no solution if the number of defects exceeds the upper bounds. That is, there is a maximum number of defects that the number of available rows and columns may be used to repair. If the number of defects in the defect matrix exceeds the upper bound, then there is no repair solution for the memory under test. For example, if a first row has a number of defects equal to the number of available columns (the most that it can have without being indicated a must-replace row and thus being filtered by block 90), then these defects may be repaired using a redundant row. Similarly, a second row with the number of defects equal to the number of available columns, and in different columns than the first row, may be repaired using another redundant row. After the number of available redundant rows are exhausted, the columns with defects remaining may be repaired using the number of available columns. Accordingly, an upper bound on the number of columns that may include defects and there still be a repair solution may be given by equation (1):

$$\text{Upper Bound Columns} = NAR*NAC + NAC \quad (1)$$

where NAR is the number of available rows and NAC is the number of available columns. Similarly, an upper bound on the number of rows that may include defects and there still be a repair solution may be given by equation (2):

$$\text{Upper Bound Rows} = NAR*NAC + NAR \quad (2)$$

where NAR and NAC are as defined above.

The find solution function 80 may compute the upper bounds as given in equations (1) and (2) above (block 92) and may check to see if the number of columns with defects exceeds equation (1) or if the number of rows with defects exceeds equation (2) (decision block 94). If so, the find solution function returns an indication of no solution (block 96). It may also be shown that an upper bound on the number of total defects that may be repaired is given by:

$$\text{Upper Bound Defects} = 2*NAR*NAC \quad (3)$$

where NAR and NAC are as defined above. This upper bound may be used in other embodiments as well.

It is noted that the upper bound check illustrated by blocks 92 and 94 is an early detection of no solution. Accordingly, the upper bound check is optional and may not be implemented in some other embodiments.

If the upper bounds check does not result in returning the indication of no solution (decision block 94—"no" leg), the find solution function 80 selects a line represented in the defect matrix to repair (block 98). Various strategies for selecting the line may be used. For example, one strategy may be to select the line that has the most defects in it (thus leaving the fewest defects to be attacked in the recursive call after the defects are deleted from the defect matrix). Another strategy may be to select a line that has a number of defects closest to the number of available cross lines. Such a selection, along with attempting the cross lines solution first, may lead quickly to a determination of no solution or to locating a solution. Any line selection may be made, including a random one.

Additionally, at block 98, the find solution function 80 may select whether to attempt the cross lines solution first or the line solution first, referred to herein as the "cross lines first selection". That is, there are two possible repairs for a line with defects: replacing the cross lines that also include the defects in the line with redundant cross lines, or replacing the line itself with a redundant line. Either repair option may be attempted first. There may be various strategies for making the cross lines first selection. For example, a selection that restricts the solution the most may be made. If there is more than one defect in the line, attempting the cross lines solution first may be the selection since more than one redundant cross line is consumed by such a selection. Another strategy may be to select the least expensive solution (e.g. the line solution if there is more than one defect in the line) with the hope of finding a solution more rapidly (e.g., if there are many defects to be repaired).

The find solution function 80 attempts a solution with the cross lines first selection (block 100). The attempt may generally include eliminating at least the defects in the selected line from the defect matrix. Additionally, if the cross lines solution is attempted first, defects in the cross lines that are replaced are eliminated from the defect matrix. The attempt may then include checking to see if a solution has been found, and recursively calling the find solution function 80 if a solution has not been found. Additional details are provided in FIG. 8, described below.

If the attempt using the first repair option results in a solution (decision block 102 —"yes" leg), the find solution function returns the repair solution (block 104). Generally, the repair solution returned includes the repair solution generated by any recursive calls to the find solution function, along with an indication of the line or cross lines selected for repair in block 100.

If the attempt using the first repair option results in no solution (decision block 102—"no" leg), the find solution function 80 may attempt a solution using the selected line and the opposite cross lines first selection as was used in block 100 (block 106). That is, if the cross lines solution was attempted in block 100, the line solution is attempted in block 106. If the line solution was attempted in block 100, the cross lines solution is attempted in block 106. This repair option is referred to as the second repair option for the selected line.

If the attempt using the second repair option results in a solution (decision block 108—"yes" leg), the find solution function 80 returns the repair solution (block 110). As with block 104, the returned repair solution may include the repair solution generated by any recursive calls to the find solution function, along with an indication of the line and/or cross lines selected for repair in block 106. On the other hand, if the attempt using the second repair operation results in no solution (decision block 108—"no" leg), there is no solution and the find solution function 80 returns an indication of no solution (block 112).

It is noted that, for embodiments in which the memory under test implements only redundant columns, the find solution function 80 may be recoded to select columns only, and only one attempt to find a solution (using the line solution) may be attempted. If no solution is found, there is no solution. Alternatively, the same code may be used with the number of available rows set to zero. Similarly, for embodiments in which the memory under test implements only redundant rows, the find solution function 80 may be recoded to select rows only, and only one attempt to find a solution (using the line solution) may be attempted. If no solution is found, there is no solution. Alternatively, the same code may be used with the number of available columns set to zero.

Figure 8:
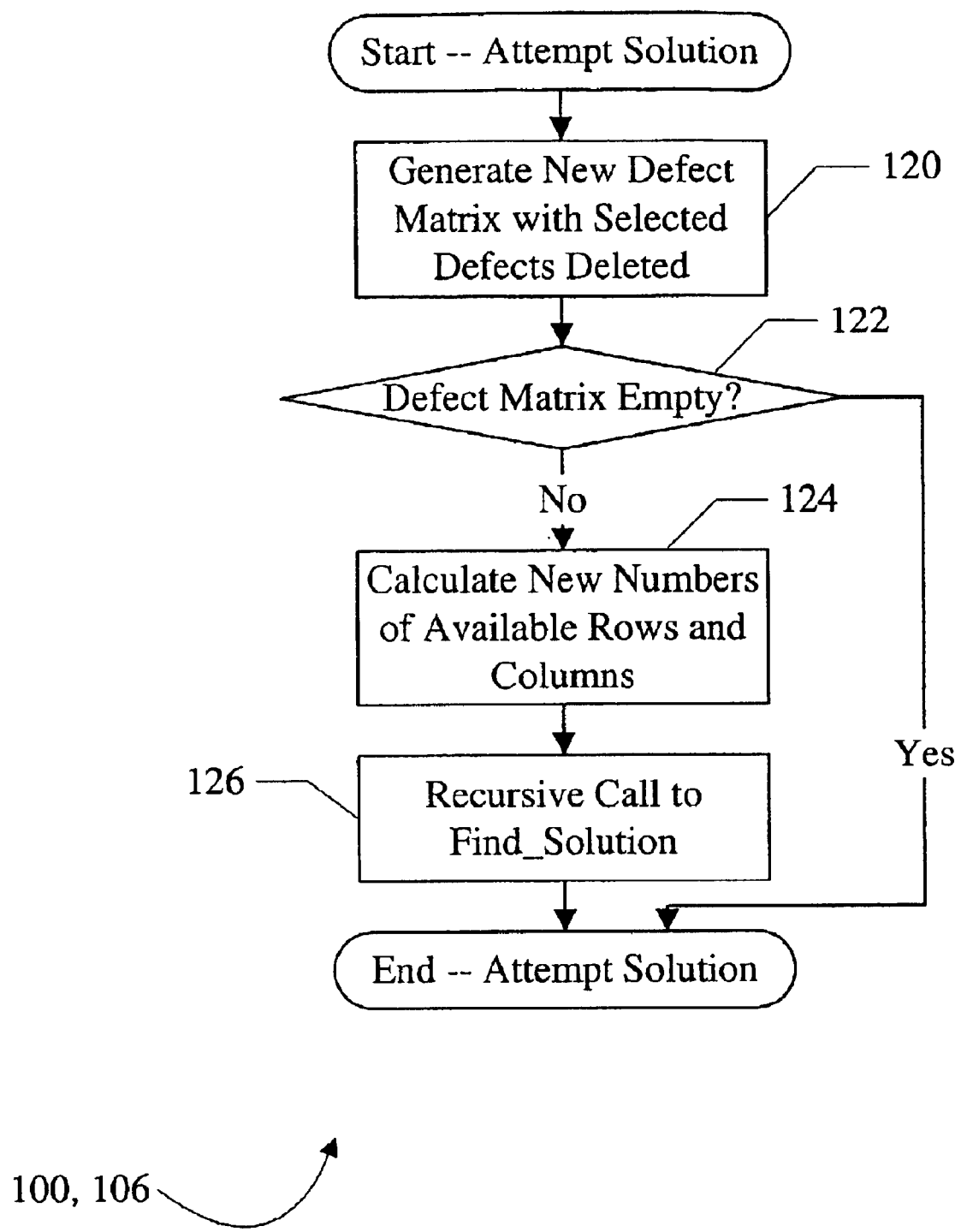
FIG. 8 is a flowchart illustrating one embodiment of attempting a solution shown in FIG. 7.

FIG. 8 is a flowchart illustrating one embodiment of attempting a solution using a repair option (e.g. either of blocks 100 or 106 in FIG. 7). While the blocks are shown in FIG. 8 in a particular order for ease of understanding, other orders may be used. Additionally, embodiments implementing the analysis agent 52 in hardware may perform various blocks in parallel and/or may pipeline various blocks over multiple clock cycles, as desired. For embodiments implementing the analysis agent 52 in software, the software may include one or more instructions which, when executed, perform the operation shown in FIG. 8.

The find solution function 80 generates a new defect matrix equal to the defect matrix provided to the find solution function 80 with defects repaired by the selected repair option deleted. That is, at least the defects in the selected line are deleted. If the cross lines solution is being attempted, any additional defects in the cross lines (and in other rows) are also deleted from the defect matrix (block 120). The find solution function 80 may check to see if the defect matrix is empty (that is, if the defect matrix indicates that there are no more defects to be repaired) (decision block 122). If so (decision block 122—"yes" leg), the find solution function 80 has found absolution and the find solution function 80 will return a solution (via decision block 102 or 108). If the defect matrix is not empty (decision block 122), the find solution function 80 calculates the new numbers of available rows and columns (modified to reflect the consumption of the line or cross lines) (block 124) and recursively calls the find solution function 80 with the new defect matrix and the new numbers of available columns and rows (block 126).

Turning now to FIG. 9, a flowchart is shown illustrating one embodiment of filtering out must-replace rows and columns (block 90 in FIG. 7). While the blocks are shown in FIG. 9 in a particular order for ease of understanding, other orders may be used. Additionally, embodiments implementing the analysis agent 52 in hardware may perform various blocks in parallel and/or may pipeline various blocks over multiple clock cycles, as desired. For embodiments implementing the analysis agent 52 in software, the software may include one or more instructions which, when executed, perform the operation shown in FIG. 9.

The find solution function 80 scans the defect matrix to see if a must-replace row is detected (decision block 130). If a must-replace row is detected (decision block 130—"yes" leg), the find solution function 80 may update the repair solution to indicate repair of the must-replace row and may update the defect matrix to delete the defects from the must-replace row (block 132). Additionally, the find solution function 80 may decrement the number of available rows. The find solution function 80 may check if the number of available rows is less than zero (decision block 134), and may return an indication of no solution if the number of available rows is less than zero (block 136).

The find solution function 80 also scans the defect matrix to see if a must-replace column is detected (decision block 138). If a must-replace column is detected (decision block 138—"yes" leg), the find solution function 80 may update the repair solution to indicate repair of the must-replace column and may update the defect matrix to delete the defects from the must-replace column (block 140). Additionally, the find solution function 80 may decrement the number of available columns. The find solution function 80 may check if the number of available columns is less than zero (decision block 142), and may return an indication of no solution if the number of available columns is less than zero (block 144).

The find solution function 80 may check if at least one must-replace row or must-replace column has been found (decision block 146) and may repeat blocks 130–144 if at least one must-replace row or must-replace column has been found. That is, the find solution function 80 may loop through detecting must-replace rows and must-replace columns until no must-replace rows or must-replace columns are found. It is noted that, in other embodiments, each iteration may find multiple must-replace rows or multiple must-replace columns per iteration, if they exist in the defect array at that time. However, another iteration may be performed if at least one must-replace column is found, since the usage of another redundant column may create additional must-replace rows. It is noted that checking for must-replace columns and checking for must-replace rows may be performed in either order.

Once no more must-replace rows and must-replace columns are found (decision block 146—"no" leg), the find solution function 80 may check if the number of available rows or the number of available columns is zero (decision block 148). If the number of available rows is reduced to zero, then all columns having a defect are must-replace columns. Similarly, if the number of available columns is reduced to zero, then all rows having a defect are must-replace rows. If the loop indicated by blocks 130–146 is exited without returning no solution, then a solution has been found. Accordingly, if the number of available rows or the number of available columns is zero (decision block 148—"yes" leg), the find solution function 80 returns the repair solution (block 150).

Figure 10:
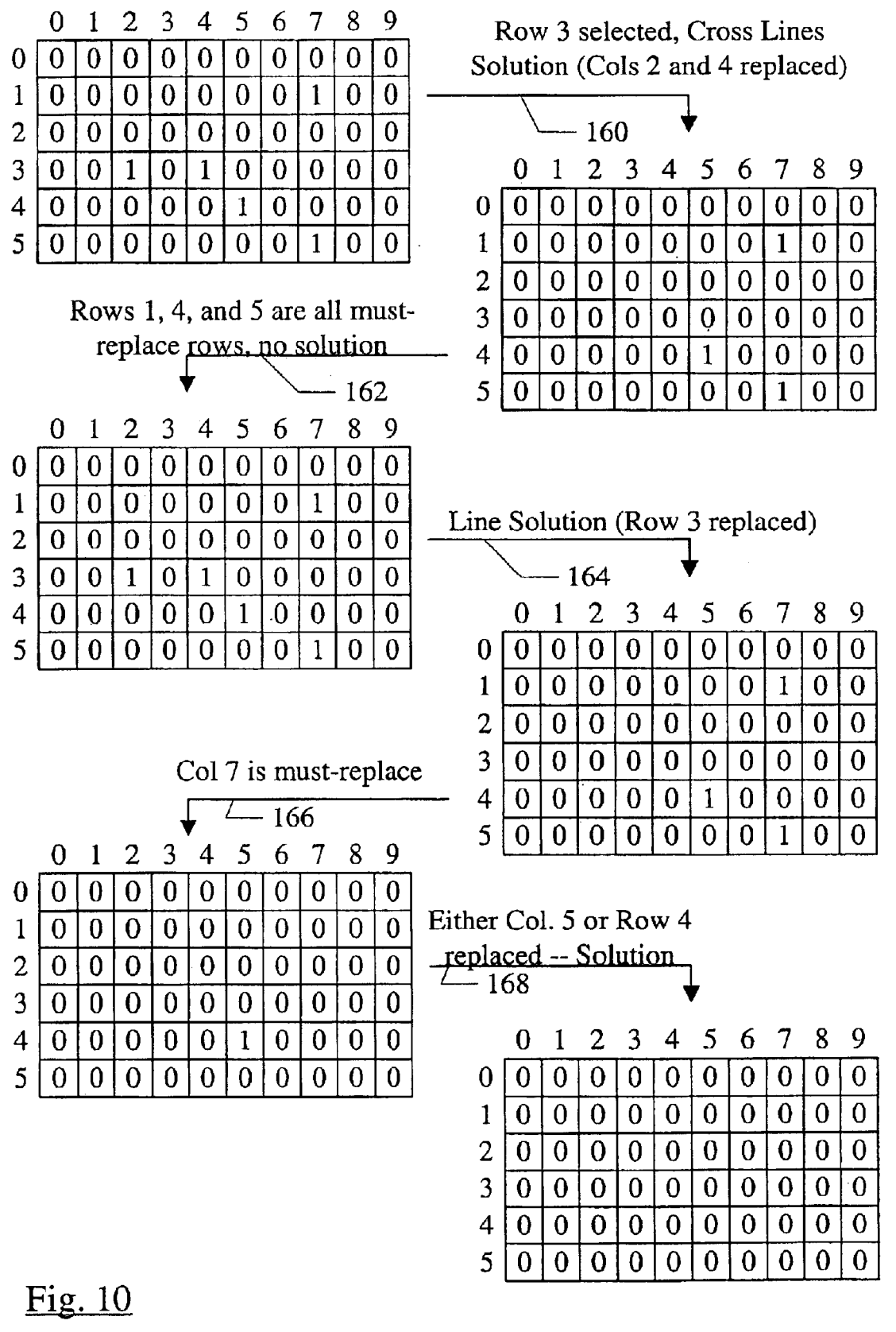

Turning now to FIG. 10, an example of applying the analysis agent to an exemplary defect matrix is shown. In the example, 2 redundant rows and 2 redundant columns are provided (not shown in FIG. 10). The exemplary matrix includes 6 rows and 10 columns. Each matrix entry indicates a defect with a set bit, and no defect with a clear bit. Accordingly, at the beginning of the example, the defect matrix indicates defects in row 1, column 7; row 3, column 2; row 3, column 4; row 4, column 5; and row 5, column 7.

There are no must-replace rows at the beginning of the example (no row has more than 2 defects) and no must-replace columns at the beginning of the example (no column has more than 2 defects). Accordingly, the find solution function 80 selects a line and a repair option for the line. In the example, the find solution function 80 selects row 3 and the cross lines solution (arrow 160). Accordingly, the defects in columns 2 and 4 (the cross lines of row 3 that include the defects in row 3) are deleted, leading to the defect matrix at the head of arrow 160. There are still defects in the defect matrix, and thus a recursive call to the find solution function 80 is made. For the recursive call, the number of available rows is 2 and the number of available columns is zero.

Since the number of available column is zero, each of the remaining rows with defects (rows 1, 4, and 5) are must-replace rows (arrow 162). There are 2 available rows, and thus the filtering of must-replace rows in the find solution function 80 results in a return of no solution to the first call of the find solution function 80. The defect matrix at the head of arrow 162 is thus returned to its original contents.

The find solution function selects the line solution (with row 3 still selected), and thus replaces row 3 in the defect matrix (arrow 164). The defect matrix is not empty, and thus a recursive call is made to the find solution function 80. The number of available rows is 1 and the number of available columns is 2 for the recursive call.

Since the number of available rows is 1 and column 7 has two defects, column 7 is a must-replace column (arrow 166). Accordingly, column 7 is filtered out and the number of available columns is 1. The defect matrix has one remaining defect, and thus the find solution function 80 selects either row 4 or column 5 for repair (arrow 168). For example, row 4 may be selected. The resulting defect matrix is empty, and thus the find solution function 80 returns a repair solution including column 7 and row 4 in response to the recursive call. The first call to the find solution function adds row 3 to the repair solution, and returns. Accordingly, the final repair solution includes replacement of rows 3 and 4 and column 7.

It is noted that, while this example only has one level of recursive calls, in general any number of recursive calls may occur depending on the number of defects in the memory under test and the arrangement of the defects in the rows and columns.

In some embodiments, a memory array may be designed as multiple blocks which may share redundant rows or columns. That is, a shared redundant row may be used to replace the same row in each of the sharing blocks. In such an embodiment, a must-replace row may be detected if the number of defects in a row in any of the sharing blocks is greater than the number of available columns for that block. The number of available columns may vary among the sharing blocks. Similarly, a shared redundant column may be used to replace the same column in each of the sharing blocks. In such an embodiment, a must-replace column may be detected if the number of defects in a column in any of the sharing blocks is greater than the number of available rows for that block. The number of available rows may vary among the sharing blocks.

The find solution function 80 may be modified to handle the above type of structure as well. For example, separate defect matrices may be maintained for each sharing block, but if a shared row or column is used then each of the defect matrices may be updated to reflect the repair using the shared row or column. The find solution function may select any line in any defect matrix at each level of recursion. A solution that removes the defects in each of the sharing blocks may be found. Additionally, the upper bounds checks may be modified to account for the sharing of redundant rows or columns as well.

Figure 11:
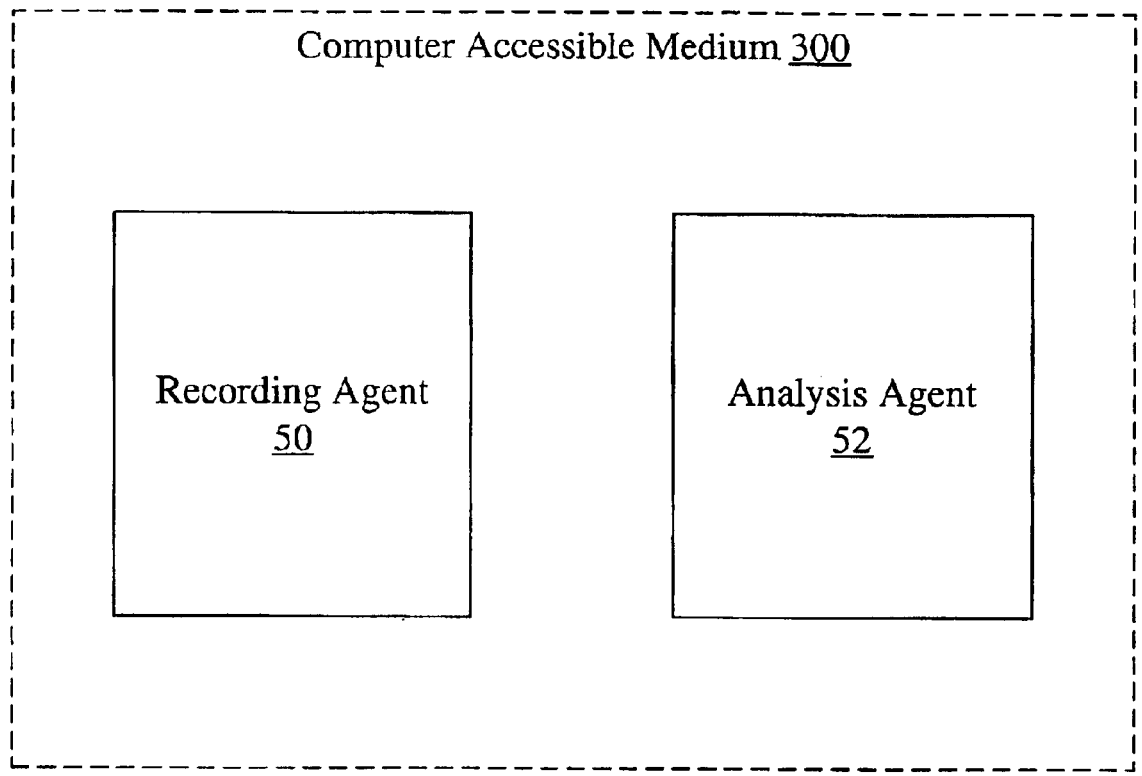
FIG. 11 is a block diagram of one embodiment of a computer accessible medium.

Turning next to FIG. 11, a block diagram of a computer accessible medium 300 is shown. The computer accessible medium may store instructions which, when executed, implement the recording agent 50 and/or the analysis agent 52 (or portions thereof). Generally speaking, a computer accessible medium may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link. In some embodiments, the computer accessible medium 300 may be accessible to the computer system 48 (or a part of the computer system 48).

Numerous variations and modifications will become apparent to those skilled in the art once the above disclosure is fully appreciated. It is intended that the following claims be interpreted to embrace all such variations and modifications.

What is claimed is:

1. A method for locating a repair solution for a memory that includes a memory array comprising a plurality of rows and a plurality of columns, N redundant rows, and M redundant columns, where N and M are integers and where N is greater than or equal to zero and M is greater than or equal to zero, and wherein the N redundant rows and the M redundant columns are collectively redundant lines, the method comprising:

generating a first defect matrix representing defects in the memory array;

recursively, until either the repair solution is found or the redundant lines are consumed:
selecting a first line represented in the defect matrix and having at least one defect;
generating a second defect matrix by eliminating at least the defects in the first line from the first defect matrix; and
determine if the repair solution is found.

2. The method as recited in claim 1 further comprising:

selecting a first repair option for the first line as either (i) one of the redundant lines, or (ii) one or more redundant cross lines; wherein, if the first line is a row then the redundant columns are redundant cross lines, and wherein, if the first line is a column then the redundant rows are redundant cross lines.

3. The method as recited in claim 2 wherein, if the first repair option does not result in a solution, the method further comprises:

selecting a second repair option as the one of (i) and (ii) that was not selected as the first repair option; and recursively, until either the repair solution is found or the redundant lines are consumed: selecting the first line, generating the second defect matrix; and determining if the solution is found.

4. The method as recited in claim 3 wherein, if no repair solution is found with the second repair option, then there is no repair solution for the memory.

5. The method as recited in claim 1 further comprising filtering out must-replace rows prior to beginning recursion.

6. The method as recited in claim 5 further comprising, prior to selecting the first line, filtering out must-replace rows and must-replace columns.

7. The method as recited in claim 6 wherein, if a result of filtering out the must-replace rows and must-replace columns is that there are zero remaining redundant rows or zero remaining redundant columns, then a repair solution is located for the memory.

8. The method as recited in claim 5 wherein, if a number of remaining redundant rows after the filtering is less than zero, then there is no repair solution for the memory.

9. The method as recited in claim 5 further comprising checking an upper bound of a number of repairable defects against a number of defects represented in the defect matrix, and determining that there is no solution if the number of defects exceeds the number of repairable defects.

10. The method as recited in claim 9 wherein an upper bound for a number of columns having defects is the sum of a number of available redundant columns and the product of the number of available redundant columns and the number of available redundant rows.

11. The method as recited in claim 9 wherein an upper bound for a number of rows having defects is the sum of a number of available redundant rows and the product of a number of available redundant columns and a number of available redundant rows.

12. A computer accessible medium comprising one or more instructions which, when executed, perform a method for locating a repair solution for a memory that includes a memory array comprising a plurality of rows and a plurality of columns, N redundant rows, and M redundant columns, where N and M are integers and where N is greater than or equal to zero and M is greater than or equal to zero, and wherein the N redundant rows and the M redundant columns are collectively redundant lines, the method comprising:

generating a first defect matrix representing defects in the memory array;

recursively, until either the repair solution is found or the redundant lines are consumed:

selecting a first line represented in the defect matrix and having at least one defect;

generating a second defect matrix by eliminating at least the defects in the first line from the first defect matrix; and determining if the repair solution is found.

13. The computer accessible medium as recited in claim 12 wherein the method further comprises:

selecting a first repair option for the first line as either (i) one of the redundant lines, or (ii) one or more redundant cross lines; wherein, if the first line is a row then the redundant columns are redundant cross lines, and wherein, if the first line is a column then the redundant rows are redundant cross lines.

14. The computer accessible medium as recited in claim 13 wherein, if the first repair option does not result in a solution, the method further comprises:

selecting a second repair option as the one of (i) and (ii) that was not selected as the first repair option; and recursively, until either the repair solution is found or the redundant lines are consumed: selecting the first line, generating the second defect matrix; and determining if the solution is found.

15. The computer accessible medium as recited in claim 14 wherein, if no repair solution is found with the second repair option, then there is no repair solution for the memory.

16. The computer accessible medium as recited in claim 12 wherein the method further comprises filtering out must-replace rows prior to beginning recursion.

17. The computer accessible medium as recited in claim 16 wherein the method further comprises, prior to selecting the first line, filtering out must-replace rows and must-replace columns.

18. The computer accessible medium as recited in claim 17 wherein, if a result of filtering out the must-replace rows and must-replace columns is that there are zero remaining redundant rows or zero remaining redundant columns, then a repair solution is located for the memory.

19. The computer accessible medium as recited in claim 16 wherein, if a number of remaining redundant rows after the filtering is less than zero, then there is no repair solution for the memory.

20. The computer accessible medium as recited in claim 16 wherein the method further comprises checking an upper bound of a number of repairable defects against a number of defects represented in the defect matrix, and determining that there is no solution if the number of defects exceeds the number of repairable defects.

21. The computer accessible medium as recited in claim 20 wherein an upper bound for a number of columns having defects is the sum of a number of available redundant columns and the product of the number of available redundant columns and the number of available redundant rows.

22. The computer accessible medium as recited in claim 20 wherein an upper bound for a number of rows having defects is the sum of a number of available redundant rows and the product of a number of available redundant columns and a number of available redundant rows.

23. An integrated circuit comprising:

a memory that includes a memory array comprising a plurality of rows and a plurality of columns, N redundant rows, and M redundant columns, where N and M are integers and where N is greater than or equal to zero and M is greater than or equal to zero; and a circuit coupled to the memory, the circuit configured to:

generate a first defect matrix representing defects in the memory array;

recursively, until either the repair solution is found or the redundant lines are consumed:

select a first line represented in the defect matrix and having at least one defect;

generate a second defect matrix by eliminating at least the defects in the first line from the first defect matrix; and determine if the repair solution is found.

* * * * *